United States Patent
Langer et al.

(10) Patent No.: US 8,824,981 B2
(45) Date of Patent: Sep. 2, 2014

(54) RECALIBRATION OF ENVELOPE TRACKING TRANSFER FUNCTION DURING ACTIVE TRANSMISSION

(71) Applicant: Intel Mobile Communications GmbH, Neubiberg (DE)

(72) Inventors: Andreas Langer, Lohhof (DE); Gunther Kraut, Egmating (DE); Berndt Pilgram, Munich (DE)

(73) Assignee: Intel Mobile Communications GmbH, Neubiberg (DE)

( * ) Notice: Subject to any disclaimer, the term of this patent is extended or adjusted under 35 U.S.C. 154(b) by 0 days.

(21) Appl. No.: 13/755,569

(22) Filed: Jan. 31, 2013

(65) Prior Publication Data

US 2014/0213196 A1    Jul. 31, 2014

(51) Int. Cl.
 *H04B 1/04* (2006.01)
 *H03G 1/00* (2006.01)
 *H03F 1/02* (2006.01)
 *H03F 1/32* (2006.01)

(52) U.S. Cl.
 CPC ............... *H03G 1/00* (2013.01); *H03F 1/0227* (2013.01); *H03F 1/0238* (2013.01); *H03F 1/3247* (2013.01); *H03F 1/3241* (2013.01)
 USPC ...................... 455/114.3; 455/126; 455/127.1

(58) Field of Classification Search
 CPC ... H03F 1/0227; H03F 1/0238; H03F 1/3241; H03F 1/3247
 USPC .................................... 455/114.3, 126, 127.1
 See application file for complete search history.

(56) References Cited

U.S. PATENT DOCUMENTS

| | | | | |
|---|---|---|---|---|
| 6,043,707 A | * | 3/2000 | Budnik | 330/10 |
| 6,141,541 A | * | 10/2000 | Midya et al. | 455/91 |
| 6,725,021 B1 | * | 4/2004 | Anderson et al. | 455/115.1 |
| 6,735,419 B2 | * | 5/2004 | Mitzlaff | 455/127.1 |
| 7,043,213 B2 | * | 5/2006 | Robinson et al. | 455/127.2 |
| 7,440,733 B2 | * | 10/2008 | Maslennikov et al. | 455/114.3 |
| 8,265,572 B2 | | 9/2012 | Kenington | |
| 8,433,263 B2 | * | 4/2013 | Pratt et al. | 455/126 |
| 2003/0198300 A1 | * | 10/2003 | Matero et al. | 375/297 |
| 2007/0287393 A1 | * | 12/2007 | Nandipaku et al. | 455/127.1 |
| 2009/0045872 A1 | * | 2/2009 | Kenington | 330/127 |
| 2010/0073088 A1 | * | 3/2010 | Wimpenny et al. | 330/199 |
| 2012/0155572 A1 | * | 6/2012 | Kim et al. | 375/297 |
| 2012/0200354 A1 | | 8/2012 | Ripley et al. | |
| 2012/0249238 A1 | | 10/2012 | Bartram | |
| 2013/0223565 A1 | * | 8/2013 | McCallister | 375/297 |
| 2013/0285740 A1 | * | 10/2013 | Cummins et al. | 330/2 |

FOREIGN PATENT DOCUMENTS

WO    2011098861 A1    8/2011

* cited by examiner

*Primary Examiner* — Duc M Nguyen
(74) *Attorney, Agent, or Firm* — Eschweiler & Associates, LLC

(57) ABSTRACT

An envelope tracking system and a method for adjusting a nonlinear transfer function of an envelope tracking power supply for a power amplifier are provided. An output signal of the power amplifier is provided to a feedback receiver for determining an actual performance of the envelope tracking power amplifier. An assumed performance of the envelope tracking power amplifier is determined by evaluating the non-linear transfer function at a value defined by an input signal for a transmitter including the power amplifier. A difference between the assumed performance and the actual performance provides a correctional value for the nonlinear transfer function.

30 Claims, 12 Drawing Sheets

RECALIBRATION OF ENVELOPE TRACKING TRANSFER FUNCTION DURING ACTIVE TRANSMISSION

An efficient way to optimize the power amplifier (PA) current consumption in a wireless system across the entire output power range is the use of a DC-DC converter which provides the PA supply voltage. Depending on the RF output power the output voltage of the DC-DC converter is adjusted. The lower the output power, the lower is the required PA supply voltage. Due to the voltage conversion from the battery voltage down to the lower PA supply voltage the battery current is reduced. It is possible to set the DC-DC converter output voltage based on the target RF power (average RF power) which is expected in a next period of time. This procedure is sometimes called average power tracking (APT).

So called Envelope Tracking (ET) DC-DC converters or ET modulators, are capable of further reducing the battery current. Envelope tracking describes an approach to RF amplifier design in which the power supply voltage applied to the power amplifier is constantly adjusted to ensure that the amplifier is operating at peak efficiency for the given instantaneous output power requirements.

A feature of envelope tracking is that the supply voltage of the power amplifier is not constant. The supply voltage of the power amplifier depends on the instantaneous envelope of the modulated baseband signal or RF (RF=radio frequency) input signal, input into the power amplifier. In a highly simplified description the envelope of the modulated baseband signal is calculated by means of the CORDIC (CORDIC=coordinate rotation digital computer) algorithm, followed by a delay adjustment to compensate for a different delay in the main signal path (RF signal generation path) and envelope path, then the envelope signal is shaped (pre-distorted) and finally digital-to-analog converted. This signal is applied to the envelope tracking DC-DC converter (special ultra-fast DC-DC converter) which generates the variable power amplifier supply voltage.

An envelope tracking capable DC-DC converter follows the instantaneous envelope of the RF signal which removes the voltage headroom and further increases the system efficiency (=composite efficiency of the power amplifier and the DC-DC converter). It is expected that an envelope tracking capable DC-DC converter will reduce the battery current of a LTE (LTE=Long Term Evolution) signal by roughly 20+% at maximum output power relative to a standard DC-DC converter which simply follows the average power.

SUMMARY

An envelope tracking system and a method for adjusting a nonlinear transfer function of an envelope tracking power supply for a power amplifier are provided. An output signal of the power amplifier is provided to a feedback receiver for determining an actual performance of the envelope tracking power amplifier. An assumed performance of the envelope tracking power amplifier is determined by evaluating the nonlinear transfer function at a value defined by an input signal for a transmitter comprising the power amplifier. A difference between the assumed performance and the actual performance provides a correctional value for the nonlinear transfer function.

DETAILED DESCRIPTION

Figure 1:
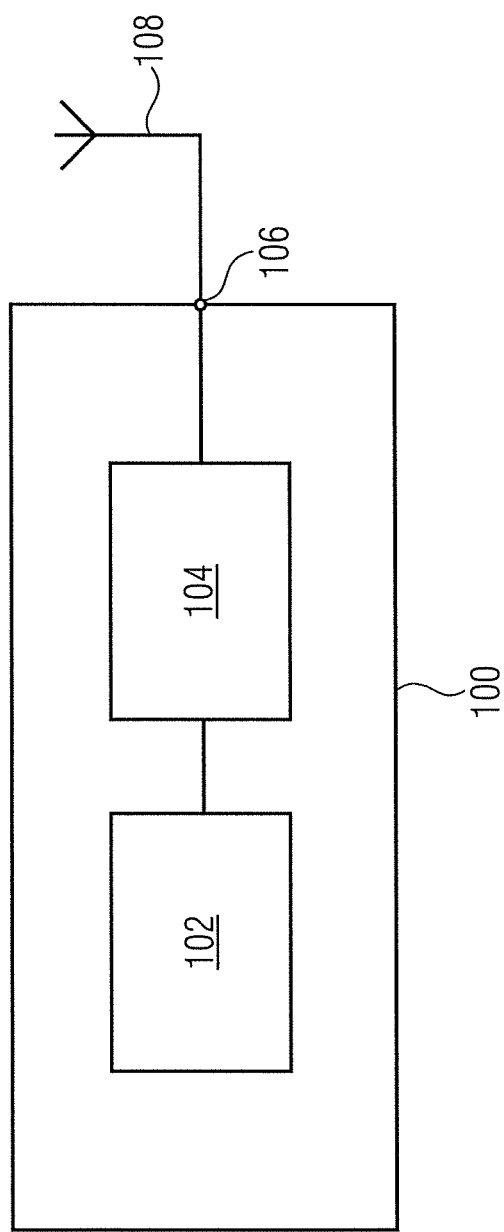
FIG. 1 shows a block diagram of an example mobile communication device.

In the following description, equal or equivalent elements or elements with equal or equivalent functionality are denoted in the following description by equal or equivalent reference numerals.

FIG. 1 shows a block diagram of an example mobile communication device 100 comprising a digital baseband processor 102, and an RF front end 104 coupled to the baseband processor 102 and to an antenna port 106. The antenna port 106 is provided to allow connection of an antenna 108 to the mobile communication device 100. The baseband processor 102 generates signals to be transmitted via the antenna 108 which are forwarded to the RF front end 104 generating a transmit signal output to the antenna port 106 for transmission via the antenna 108. The RF front end 104 may also receive signals via the antenna port 106 from the antenna 108 and provides respective signals to the baseband processor 102 for processing the received signals. The control circuit and the method described in further detail below may be implemented in the RF front end 104, for example, in a power amplifier or amplifier circuit which may provide the transmit signal output to the antenna port 106.

The mobile communication device 100 may be a portable mobile communication device and may be configured to perform a voice and/or data communication according to a mobile communication standard with other communication devices, like other mobile communication devices or base stations of a mobile communication network. Mobile communication devices may comprise a mobile handset, such as a mobile phone or a smart phone, a tablet PC, a broadband modem, a laptop, a notebook, a router, a switch, a repeater or a PC. Also, the mobile communication device 100 may be a base station of a communication network.

The power amplifier in the RF front end 104 may be an envelope tracking power amplifier in order to improve an efficiency and/or battery life of the mobile communication device 100.

Figure 2:
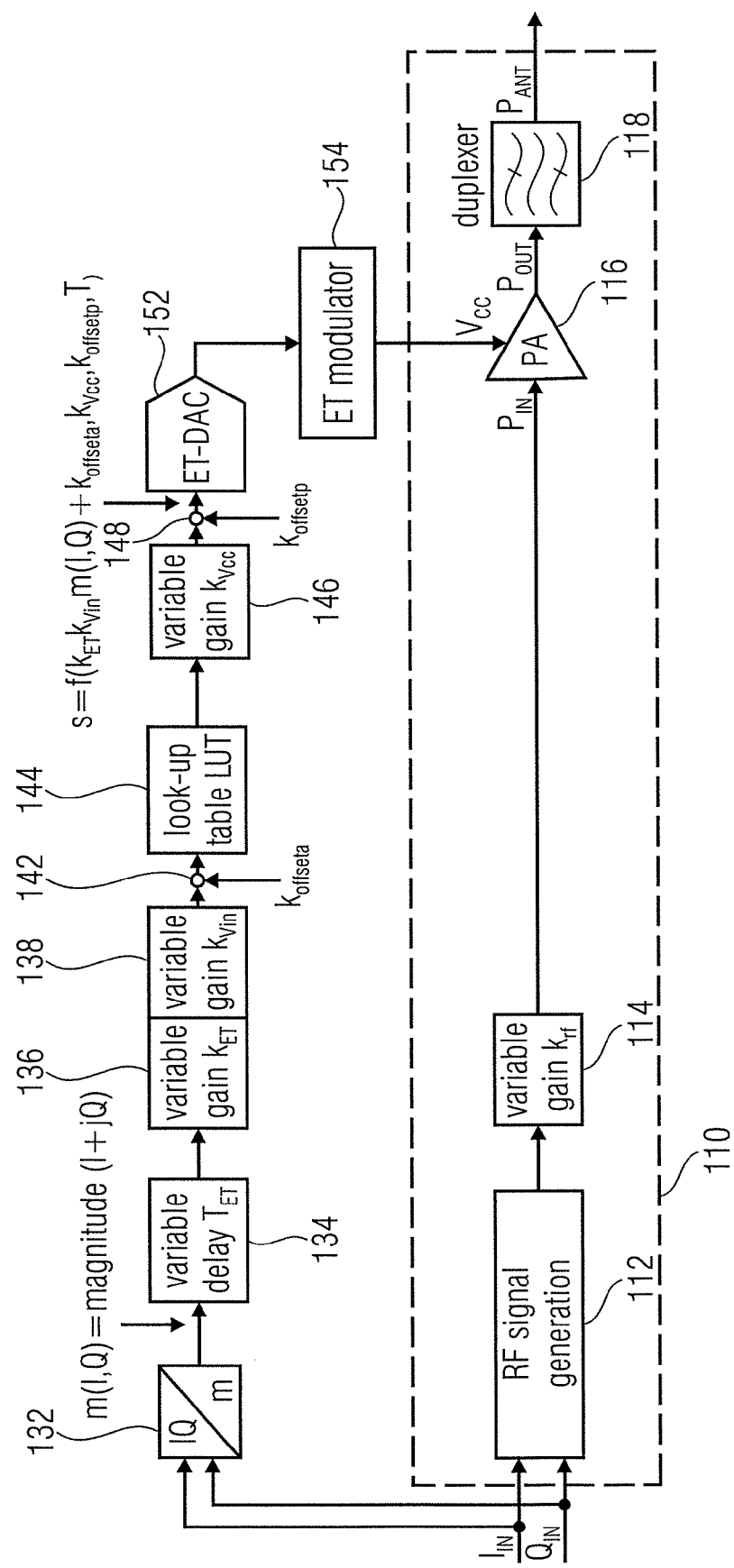
FIG. 2 shows a schematic block diagram of an envelope tracking (ET) system.

One aspect of envelope tracking (ET) is that the supply voltage to the PA is not constant. Referring to FIG. 2, the PA supply voltage $V_{CC}$ depends on the instantaneous envelope of the modulated baseband signal m(I,Q). In a highly simplified description the envelope of the modulated baseband signal (BB signal) is calculated, for example by means of CORDIC algorithm (Coordinate Rotation Digital Computer algorithm), followed by a delay adjustment to compensate for different delays in a main signal path (RF signal generation path) and an envelope path. Subsequently the envelope signal is shaped (pre-distorted) and finally digital-to-analog converted. This signal is applied to the ET DC-DC converter 154 (special ultra-fast DC-DC converter) which generates the variable PA supply voltage $V_{CC}$.

An ET capable DC-DC converter follows the instantaneous envelope of the RF signal, thereby removing the voltage headroom required by constant voltage supplies and further increasing system efficiency (=composite efficiency of PA and DC-DC converter). It is expected that an ET capable DC-DC converter will reduce the battery current of a LTE (Long Term Evolution) signal at maximum output power by more than 20% relative to a standard DC-DC converter which simply follows the average power.

FIG. 2 shows a schematic block diagram of an envelope tracking system. An input signal to be transmitted comprises an in-phase component $I_{IN}$ and a quadrature component $Q_{IN}$ in the example shown in FIG. 2. Alternatively the input signal could be provided in a different format. The input signal is provided to a transmitter 110 that comprises a RF signal generation 112, a variable gain element 114, a power amplifier (PA) 116, and a duplexer 118. The RF signal generation 112 may be configured to perform frequency up-conversion from a baseband (BB) frequency range to a radio frequency (RF) range, and/or digital-to-analog conversion of the input signal. The variable gain element multiplies an output of the RF signal generation 112 with a variable gain $k_{rf}$ which serves to achieve a desired gain setting of the entire transmitter 110. The power amplifier 116 amplifies the signal provided by the variable gain element 114, wherein an input power of the PA 116 is $P_{IN}$ and an output power is $P_{OUT}$. The amplified amplifier output signal is fed to the duplexer 118 which separates transmitted and received signals in the frequency domain. At an antenna port of the duplexer 118 the signal is typically slightly attenuated to an antenna power $P_{ANT}$, compared to the output power $P_{OUT}$ of the power amplifier 116.

To allow ET operation and to maximize efficiency enhancement in an ET system, the PA 116 may be designed in a different way compared to a traditional PA design which is optimized for average power tracking.

One important ET specific design target on a system level is a flat AMPM- and AMAM phase response of the PA 116 versus PA supply voltage $V_{CC}$ and across output power (in this context PA supply voltage $V_{CC}$ means the voltage which is influenced by ET operation, for example the supply voltage of a $2^{nd}$ PA stage). The abbreviation AMPM stands for "amplitude-to-phase distortion" and the abbreviation AMAM stands for "amplitude-to-amplitude distortion".

An ET friendly overall AMAM and/or AMPM characteristic can be for instance achieved if the PA supply voltage is pre-distorted. In this case the PA supply voltage is not a simple linear response to the magnitude of the BB envelope signal m(I,Q). The PA supply voltage $V_{CC}$ depends on the magnitude of the BB envelope signal in a nonlinear way. The nonlinear shaping function is for example selected such that the PA gain is constant and becomes independent of the instantaneous PA supply voltage $V_{CC}$ when the PA 116 operates in the ET mode. In FIG. 2 the nonlinear transfer function is implemented, inter alia, by a lookup table (LUT) 144. This is just an example for an embodiment of a nonlinear transfer function.

The lookup table 144 is part of a supply voltage processing path which is depicted in FIG. 2 above the transmitter 110. The supply voltage processing path is, in turn, a part of the envelope tracking system.

The supply voltage processing path comprises a vector-to-magnitude converter 132. The instantaneous magnitude of the input signal is expressed as m(I,Q)=magnitude(I+jQ) which is forwarded to a variable delay element 134 configured to delay the magnitude signal by a delay $T_{ET}$. The supply voltage processing path further comprises a variable gain element 136 with a variable gain $k_{ET}$. The variable gain $k_{ET}$ may be synchronized with the variable gain $k_{rf}$ of the transmitter 110 (not explicitly shown in FIG. 2). At a summing element 142 an input signal offset $k_{offseta}$ is added before the signal is provided to a lookup table (LUT) 144. The lookup table 144 implements a nonlinear transfer function or at least the basic shape of the non-linear transfer function. The supply voltage processing path further comprises a further variable gain element 146 for applying a variable gain $k_{VCC}$ to an output signal of the lookup table 144. At a further summing element 148 an output signal offset $k_{offsetp}$ is added before the signal is digital-to-analog converted by an envelope tracking digital-to-analog converter (ET-DAC) 152. An analog output signal of the ET-DAC 152 is fed to the ET modulator 154 to control the ET modulator 154 and to cause the same to provide a corresponding supply voltage $V_{CC}$ to the envelope tracking power amplifier 116.

The nonlinear ET transfer function is typically sensitive to part to part variation of PA 116, ET modulator 154 and/or RF signal generation 112. Thus, as a result the transfer function must be calibrated during production of the wireless device. Furthermore, re-calibration is necessary after production to compensate for aging effects, for example.

The nonlinear ET transfer function is typically the transfer function between the input of the vector-to-magnitude converter 132 and the output of the ET modulator 154. Not all of the depicted elements 132, 134, 136, 138, 142, 146, and 148 need to be present, but are typically optional.

With some envelope tracking systems, the nonlinear ET transfer function is only calibrated once during factory calibration for a 50 ohm termination. Thus, factory calibration does have its limitations, i.e., (1) the transfer function might change over time, (2) only a limited number of transfer functions can be stored in the RF transceiver, and (3) the factory calibration process does not fully reflect real-life use cases of a mobile device, e.g., the antenna impedance does change depending on the position of the mobile device relative to the mobile device user. Antenna impedance change does affect the PA behavior, i.e., for some antenna impedances the PA supply $V_{CC}$ needs to be increased to maintain antenna output power and for other antenna impedances the PA supply Vcc needs to be decreased to reach the same output power. Thus, several measures need to be carried out to compensate possible ET transfer function changes. The following five measures or parameters may be defined:

(1) Offset compensation via $k_{offseta}$ before applying the nonlinear ET transfer function
(2) Gain compensation via $k_{Vin}$ before applying the nonlinear ET transfer function
(3) Offset compensation via $k_{offsetp}$ after application of the nonlinear ET transfer function
(4) Gain compensation via $k_{Vcc}$ after applying the nonlinear ET transfer function
(5) Exchange of the nonlinear ET transfer function itself with a more suitable ET transfer function With the methods for adjusting or re-calibration disclosed, and/or with as the envelope tracking system disclosed herein, a re-calibration/fine-tuning of one or more of these parameters can be achieved even during active transmission of a mobile device with the use of a feedback receiver.

The PA gain might need to be temperature compensated by the signal path gain $k_{rf}$ before the nonlinear ET transfer function can be re-adjusted. Furthermore, the ET path gain $k_{ET}$ might need to be set synchronously with the signal path gain $k_{rf}$.

Two different power control modes may be considered for re-calibration/fine-tuning of the nonlinear transfer function during active transmission, i.e., (1) without power-control loop and
(2) with closed power control loop.

Figure 3:
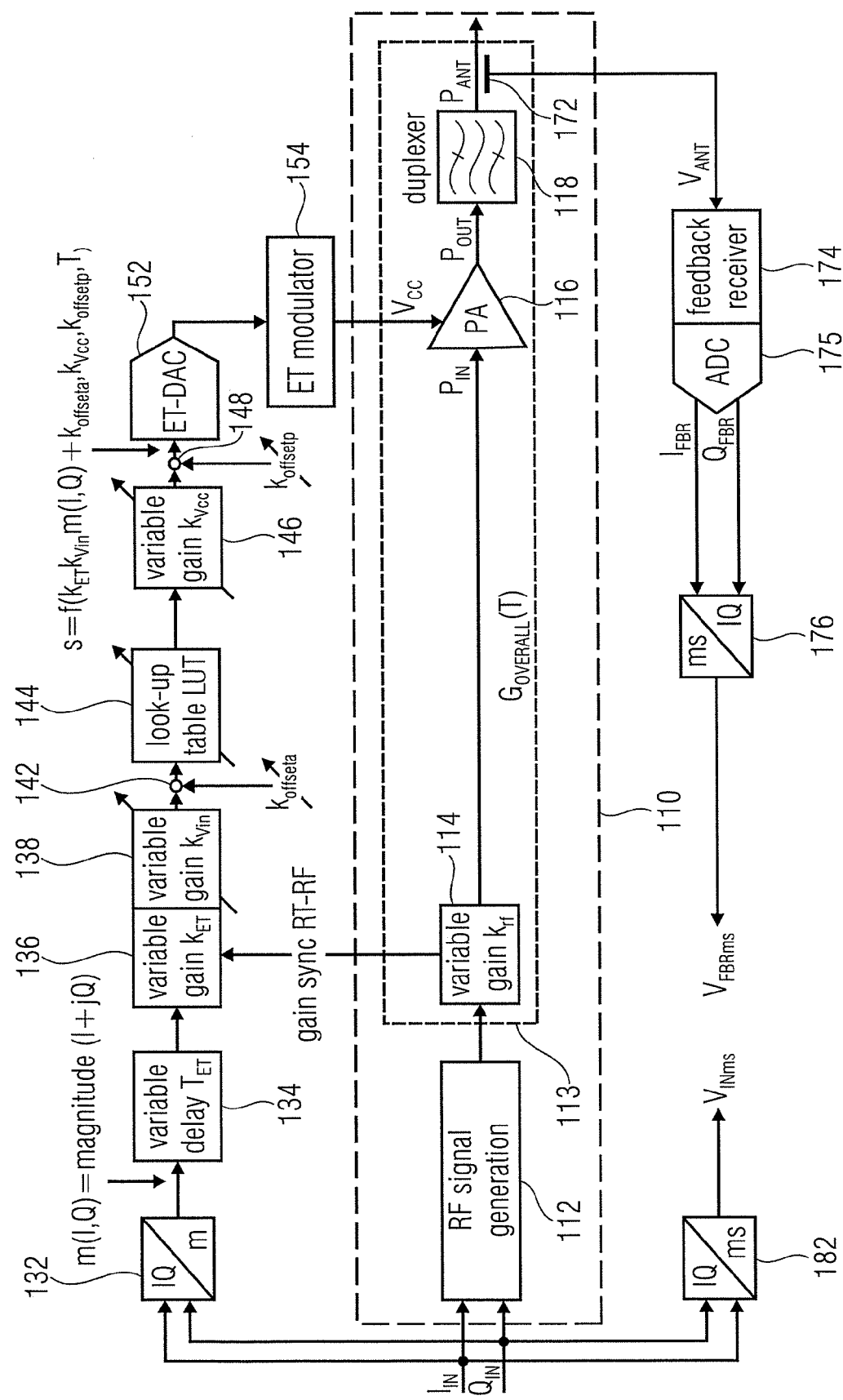
FIG. 3 schematically shows an example of an ET system without a power-control loop.

In FIG. 3 an example of an ET system without a power-control loop is depicted. $V_{CC}$ adjustment by application of one or more of the five measures ($k_{offseta}$, $k_{Vin}$, $k_{offsetp}$, $k_{Vcc}$, change of nonlinear ET transfer function) described above is achieved by means of a feedback receiver 174. The envelope tracking system comprises a tap 172 at an output of the duplexer 118. The signal $V_{ANT}$ at the output of the duplexer 118 is typically sufficiently similar to the output signal of the envelope tracking power amplifier 116. Alternatively, the tap 172 may be directly at the output of the envelope tracking amplifier 116. The envelope tracking system further comprises a feedback analog-to-digital converter 175 configured to provide the feedback signal in vector representation (in-phase component $I_{FBR}$ and quadrature component $Q_{FBR}$). A root-mean-square calculator 176 is configured to receive the feedback signal in vector representation and to provide a corresponding root-mean-square voltage $V_{FBRrms}$. As an alternative to the determination of the root-mean-square (rms) value, the feedback signal provided by the feedback receiver 174 and/or the feedback ADC 175 may be filtered, e.g. lowpass filtered.

The envelope tracking system further comprises a second root-mean-square calculator 182 configured to provide a root-mean-square value $V_{INrms}$ of the in-phase component $I_{IN}$ and the quadrature component $Q_{IN}$ of the input signal.

A transfer function adjuster (not depicted in FIG. 3) may receive the two rms values $V_{INrms}$ and $V_{FBRrms}$ for further processing. In particular, the transfer function adjuster may determine a correctional value or adjustment value for one of the parameters (e.g., $k_{offseta}$, $k_{Vin}$, $k_{offsetp}$, $k_{Vcc}$, coefficients of the shape of the nonlinear ET transfer function) for the nonlinear transfer function based on a difference between an assumed performance (or expected performance) of the envelope tracking power amplifier 116 and an actual performance of the envelope tracking power amplifier 116. The assumed performance may be determined on the basis of the rms value $V_{INrms}$ of the input signal. The actual performance may be determined on the basis of the rms value $V_{FBRrms}$ of the feedback signal.

Figure 4:
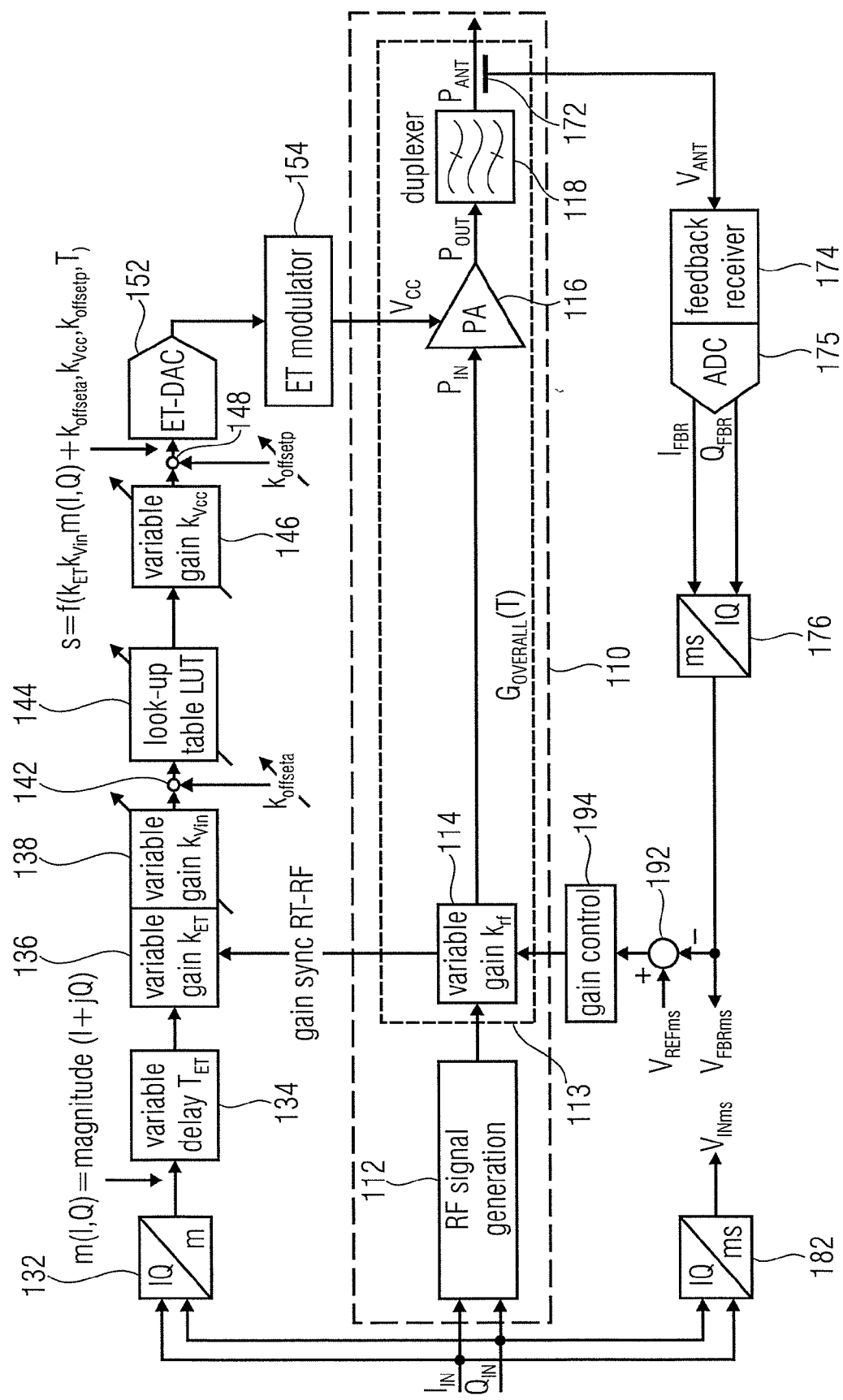
FIG. 4 schematically shows an example of an ET system with a closed power-control loop.

In FIG. 4 an example of an ET system with closed power-control loop is depicted. Here, adjustment of $V_{CC}$ by application of one of the five measures or parameters described above (e.g., $k_{offseta}$, $k_{Vin}$, $k_{offsetp}$, $k_{Vcc}$, coefficients of the shape function 144 of the nonlinear transfer function) is achieved by means of the feedback receiver 174 which is concurrently also used for closed-loop power control. The closed-loop power control comprises a gain control element 194 which acts on the variable gain element 114. The closed-loop power control further comprises an overall gain corrector 192 in the form of a summing element which subtracts the rms value $V_{FBRrms}$ of the feedback signal from a reference root-mean-square value $V_{REFrms}$. The reference root-mean-square value $V_{REFrms}$ may be provided by a gain controller (not depicted) that is part of the closed-loop power control and receives the digital feedback signal $I_{FBR}+jQ_{FBR}$ from the feedback receiver 174 and the feedback ADC 175.

Inter alia, a method is proposed which guarantees adjustment of $V_{CC}$ during active transmission by means of the feedback receiver 174 which might be concurrently used for power control. Thus, re-calibration/fine-tuning of the ET transfer function is achieved and/or made possible.

Re-calibration/fine-tuning of the ET transfer function by $V_{CC}$ adjustment is achieved with a feedback receiver 174. In the following we give a more detailed description of the Vcc adjustment by adjusting the gain $k_{Vcc}$. All other possibilities, i.e., Vcc adjustment by offsets $k_{offseta}$, $k_{offsetp}$, gain $k_{Vin}$, and even applying a different non-linear ET transfer function shape (implemented as LUT 144) follow the same procedure. By means of the rms voltage $V_{FBRrms}$ of the feedback receiver and the rms voltage $V_{INrms}$ of the input signal it is possible to calculate the total gain given by the ratio $V_{FBRrms}/V_{INrms}$. Since the gain $k_{rf}$ of main signal chain is known. the PA gain can be calculated based on the total gain. The nonlinear ET transfer function is selected such that the PA gain meets a certain target gain which was set during factory calibration. The factory calibration is done at 50 ohm conditions. As a result the target gain is achieved by applying the nonlinear ET function and 50 ohm antenna impedance. However during normal phone operation the antenna impedance does not satisfy 50 ohm conditions for most of the time. Typically, the actual PA gain will therefore deviate from the target gain which was established during factory calibration by applying the nonlinear ET function. This deviation from the target gain is captured by measuring the total gain by means of the ratio $V_{FBRrms}/V_{INrms}$ and by subsequent calculation of the PA gain. The knowledge of the actual PA gain for a given nonlinear ET function may be used to further improve performance e.g. in terms of ACLR (Adjacent Channel Leakage Ratio) in case of a non 50 ohm antenna impedance. If the actual PA gain is smaller than the target gain, this indicates, for instance, that the PA operates deeper in saturation than targeted. This will degrade ACLR- and EVM (Error Vector Magnitude) performance. The deep saturation state can be avoided e.g. by properly adjusting the gain $k_{VCC}$. Here are the detailed steps of the Vcc adjustment procedure.

(1) The feedback receiver signal $V_{FBR}$, represented by the rms value $V_{FBRrms}$, at known input signal $V_{IN}$, also given by the rms value $V_{INrms}$, and known overall gain $G_{OVERALL}(T)$ (which is a function of temperature T) are measured during active transmission.
(2) The total gain $V_{FBRrms}/V_{INrms}$ is calculated
(3) Based on total gain and based on knowledge of main signal path gain $k_{rf}$, the actual PA gain can be calculated.
(4) Gain $k_{VCC}$ is adjusted based on the actual PA gain in a predefined way (see FIG. 5)

Figure 5:
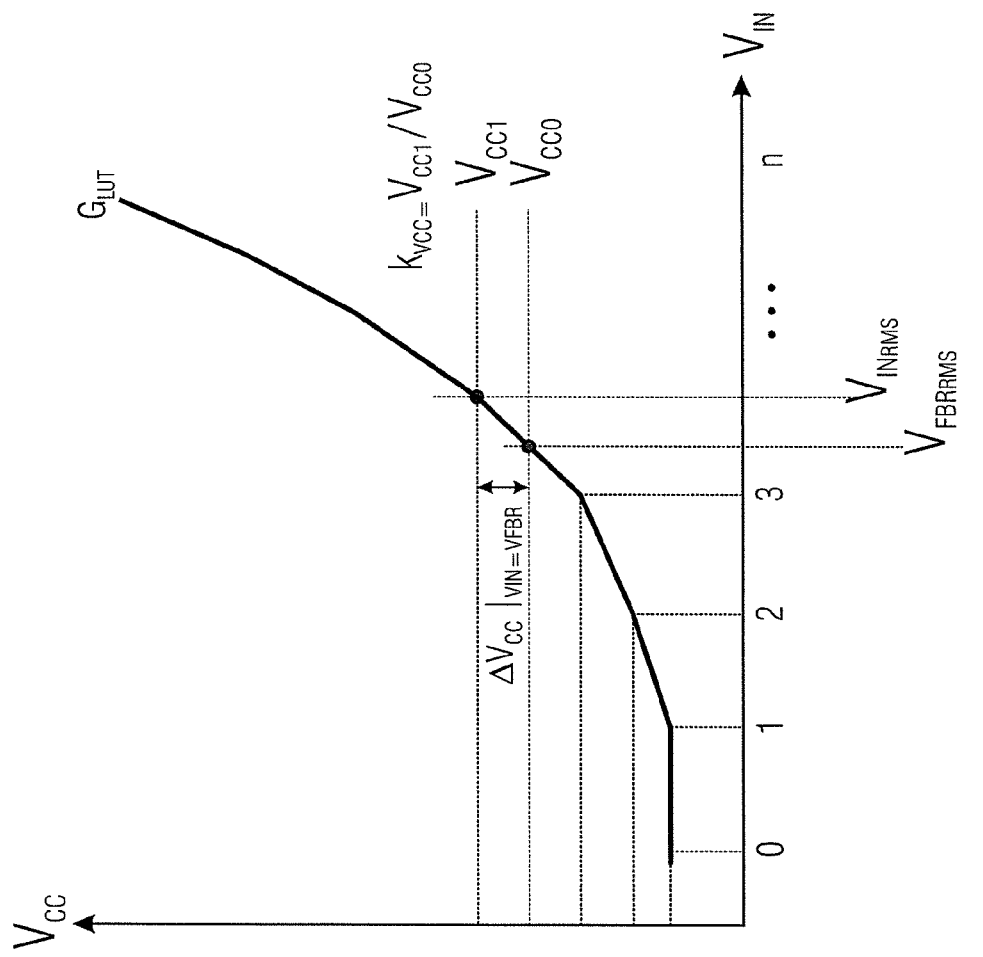
FIG. 5 schematically shows an envelope tracking transfer function GLUT as a lookup table and $k_{VCC}$ calculated from $V_{CC1}$ and $V_{CC0}$.

FIG. 5 may be interpreted as follows. $G_{LUT}$ is the currently valid nonlinear transfer function of the envelope tracking path and maps the input voltage $V_{IN}$ to the power amplifier supply voltage $V_{CC}$. When adjusted or (re-)calibrated correctly, this power amplifier supply voltage $V_{CC}$ determined in this manner causes the envelope tracking power amplifier 116 to reach the target gain that has been chosen during factory calibration. During operation, the transmitter 110 and also the envelope tracking power amplifier 116 itself are prone to variations of their operating parameters, for example, due to temperature changes, varying antenna impedance, etc.

An assumed performance of the envelope tracking power amplifier 116 may be determined by evaluating the nonlinear transfer function $G_{LUT}$ at a first value $V_{INrms}$. The first value is defined by the input signal $V_{IN}$ for the transmitter 110, the transmitter comprising the power amplifier 116. Furthermore, an actual performance of the envelope tracking power amplifier 116 may be determined by evaluating the nonlinear transfer function $G_{LUT}$ at a second value $V_{FBFrms}$. The second value is defined by the feedback signal. As the first value and the second value are not equal, a difference $\Delta V_{CC} = V_{CC1} - V_{CC0}$ of the power amplifier supply voltage results that indicates by how much the power amplifier supply voltage should be changed in order to align the actual performance and the assumed performance. A correctional value for the gain $k_{VCC}$ (or adjustment value or re-calibration value) may be determined on the basis of the power amplifier supply voltages $V_{CC1}$ and $V_{CC0}$ obtained by evaluating the nonlinear transfer function $G_{LUT}$ at the first and second values $V_{INrms}$ and $V_{FBRrms}$, respectively, i.e. $k_{VCC} = V_{CC1}/V_{CC0}$.

For re-calibration/fine-tuning of the ET transfer function the following assumptions may be made:
(1) ET transfer functions do have similar behavior and thus, an updated function can be easily estimated from one single measurement and the current transfer function. For further improvements, several measurements might be taken for re-calibration/fine-tuning.
(2) Measurements with the feedback receiver may be even taken during active transmission.
(3) The overall gain setting $G_{OVERALL}$ is kept constant during the re-calibration process.
(4) The overall gain $G_{OVERALL}$ is a function of temperature due to the temperature-dependent behavior of the PA. Thus, the gain needs to be adjusted according to the measured temperature of the mobile device.
(5) Signal path gain $k_{RF}$ and ET-path gain $k_{ET}$ are synchronously set in such a way so that the envelope signal and the envelope of the RF signal do show equal amplitude behavior.

Re-calibration/fine-tuning of the ET transfer function by $V_{CC}$ adjustment with concurrent closed power-control loop (see FIG. 3) is achieved with a feedback receiver 174. The first four steps are the same as described in section above, i.e. without closed power-control loop. Step number five may be introduced to compensate for the gain change caused by the $V_{CC}$ change.
(1) The feedback receiver signal $V_{FBR}$, represented by the rms value $V_{FBRrms}$, at known input signal $V_{IN}$, also given by the rms value $V_{INrms}$, and known overall gain $G_{OVERALL}$(T) which is a function of temperature is measured during active transmission.
(2) The total gain $V_{FBRrms}/V_{INrms}$ is calculated.
(3) Based on total gain and based on knowledge of the main signal path gain $k_{rf}$ the actual PA gain can be calculated.
(4) Gain $k_{Vcc}$ is adjusted based on actual PA gain in a predefined way (see FIG. 5)
(5) Correction of the overall gain $G_{OVERALL}$ to compensate for the gain increase/decrease due to $V_{CC}$ change, i.e., $\Delta G_{OVERALL} V_{FBRnew}/V_{FBRold}$.

For example, a power of the power amplifier may be controlled using a closed power-control loop concurrently with envelope tracking, wherein the feedback signal is used by both the closed power-control loop and the method for adjusting the nonlinear tracking function. An overall gain of a portion of the transmitter that comprises the power amplifier may be corrected by the compensation factor $\Delta G_{OVERALL}$ to compensate for a gain variation due to a change of a power amplifier supply voltage. The gain variation is typically caused by adjusting the nonlinear transfer function using the correctional value. The compensation factor is determined based on a current feedback signal and a previous feedback signal.

In particular, the compensation factor $\Delta G_{OVERALL}$ may be determined as $\Delta G_{OVERALL} = V_{FBRnew}/V_{FBRold}$. $V_{FBRnew}$ is the current feedback signal and $V_{FBRold}$ is the old feedback signal.

The proposed methods and envelope tracking systems support a calibration procedure during active transmission which re-calibrates/fine tunes the current ET transfer function via $V_{CC}$ adjustment by means of a feedback receiver 174.

Figure 6:
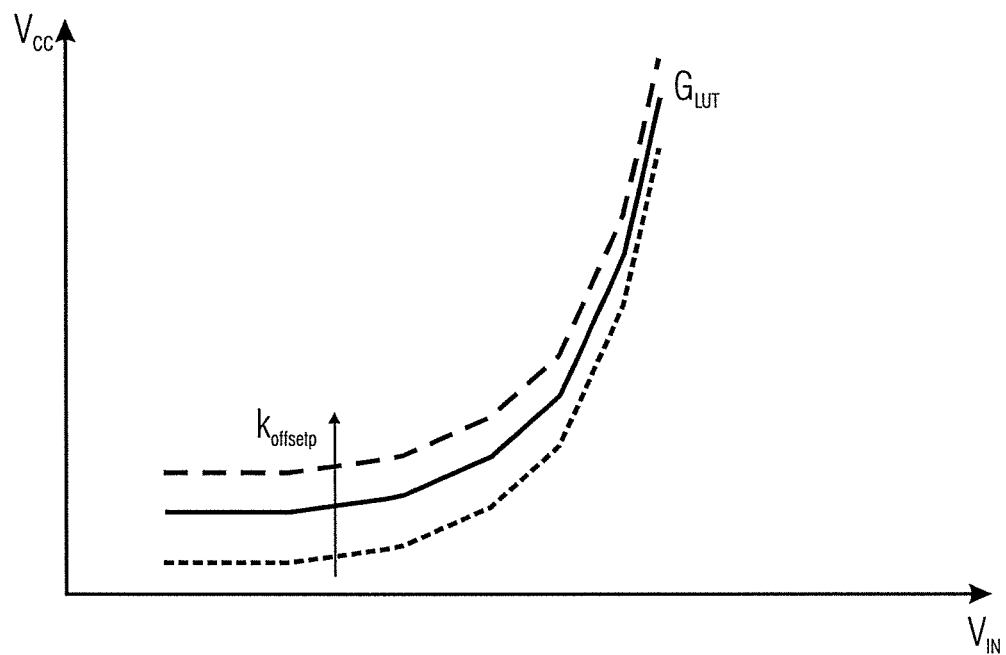
FIGS. 6 to 10 illustrate how the various parameters of the nonlinear transfer function of the envelope path influence the nonlinear transfer function.
Figure 7:
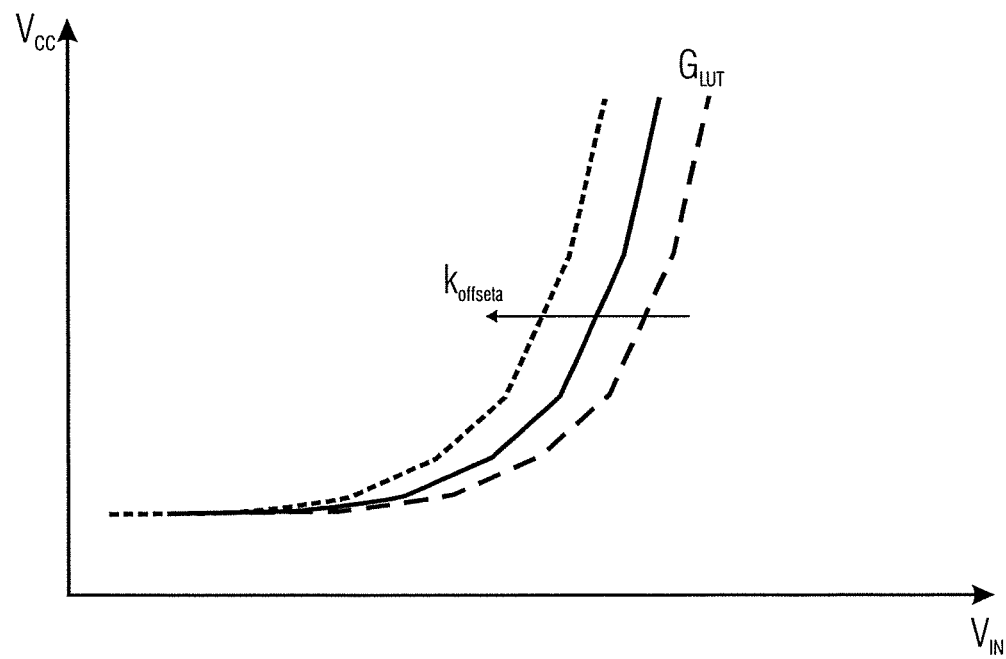
Figure 8:
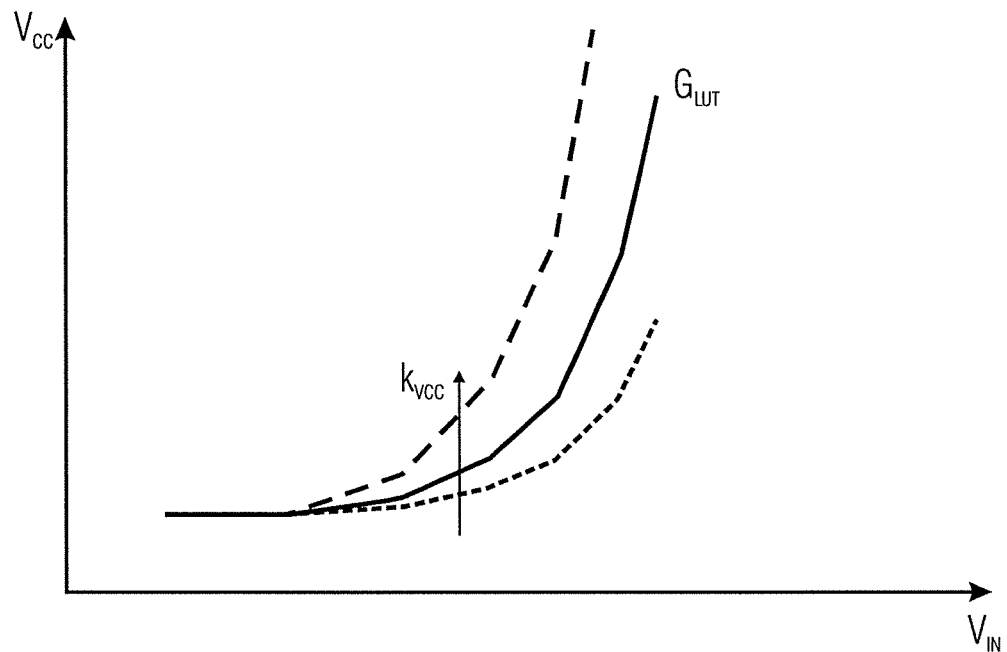
Figure 9:
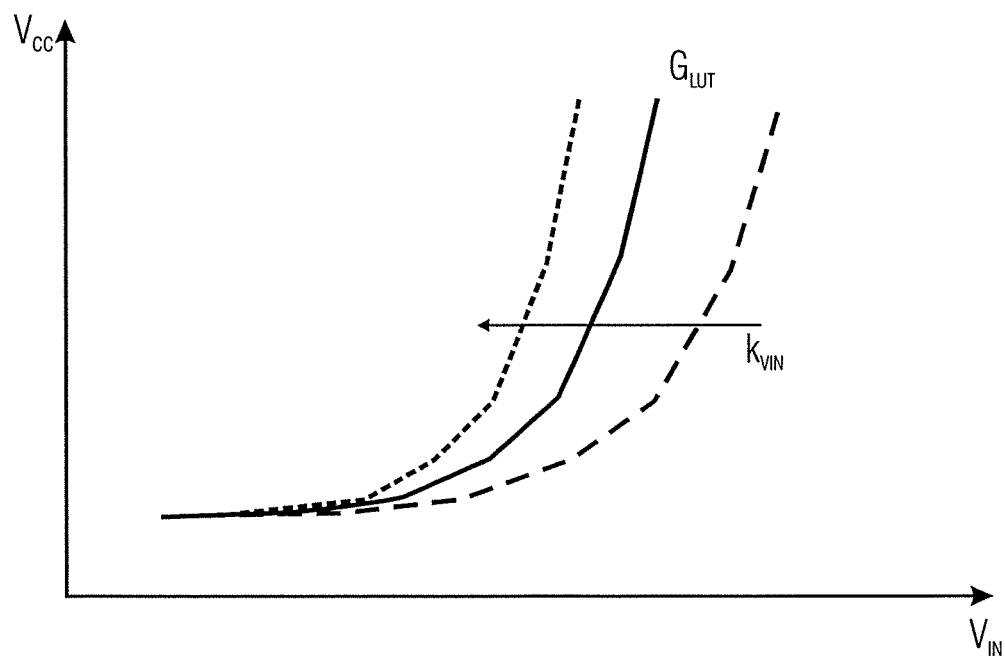
Figure 10:
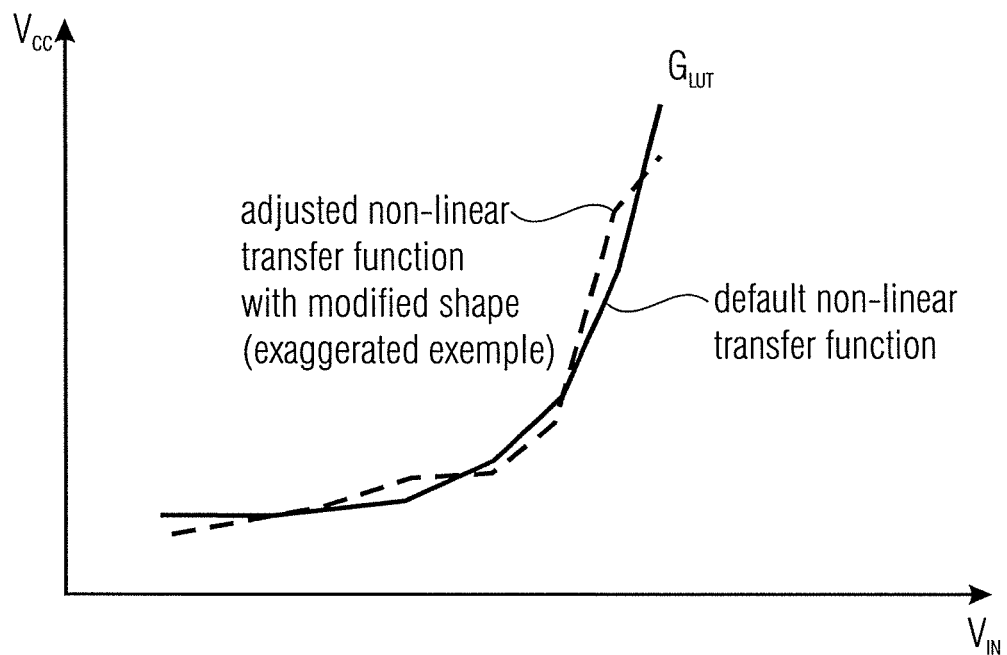

FIGS. 6 to 10 illustrate how the various parameters of the nonlinear transfer function of the envelope path influence the nonlinear transfer function. For example, varying the offset $k_{offsetp}$ shifts the curve up or down (FIG. 6). Varying the offset $k_{offseta}$ shifts the curve left or right (FIG. 7). Varying the gain $k_{VCC}$ stretches or compresses the curve in the vertical direction (FIG. 8). Varying the gain $k_{VIN}$ stretches or compresses the curve in the horizontal direction. Finally, the coefficients that define the shape of the nonlinear function may also be varied, so that a default nonlinear transfer function can be changed to an adjusted nonlinear transfer function with modified shape (FIG. 10). In this manner, the shape of the nonlinear ET transfer function can be exchanged.

Figure 11:
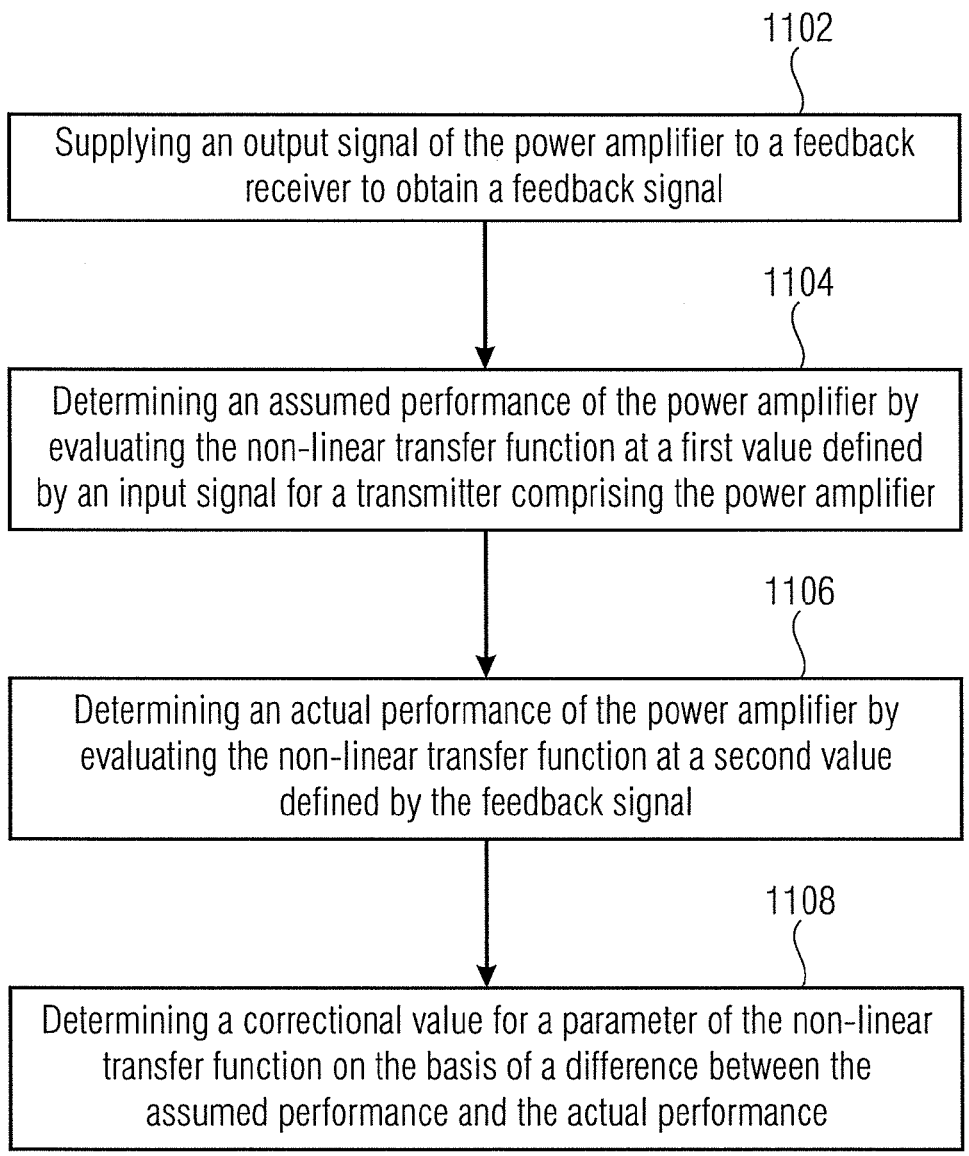
FIG. 11 shows a schematic flowchart of a method for adjusting a nonlinear transfer function of an envelope tracking power supply.

FIG. 11 shows a schematic flowchart of a method for adjusting a nonlinear transfer function of an envelope tracking power supply for a power amplifier. The method comprises supplying an output signal of the power amplifier to a feedback receiver to obtain a feedback signal at 1102. The method also comprises determining an assumed performance of the power amplifier by evaluating the nonlinear transfer function at a first value defined by an input signal for a transmitter comprising the power amplifier at 1104. An actual performance of the power amplifier is determined by evaluating the nonlinear transfer function at a second value defined by the feedback signal at 1106. The method further comprises determining a correctional value for a parameter of the nonlinear transfer function based on a difference between the assumed performance and the actual performance at 1108.

Determining the assumed performance and the actual performance of the power amplifier comprises, in one embodiment, evaluating the nonlinear transfer function at a plurality of value pairs of corresponding first and second values to obtain a plurality of differences between the assumed performance and the actual performance for a plurality of operating conditions of the envelope tracking power amplifier.

The parameter of the nonlinear transfer function may be one of:
an offset compensation $k_{offseta}$ for the input signal,
an offset compensation $k_{offsetp}$ for a supply voltage for the power amplifier,
a gain compensation $k_{VIN}$ for the input signal,
a gain compensation $k_{VCC}$ for the supply voltage, and
parameters defining a shape of the nonlinear transfer function.

Determining the actual performance may comprise determining a total gain of the transmitter based on the feedback signal and the input signal. Determining the actual performance may also comprise determining an actual gain of the power amplifier based on the total gain and a known gain of the transmitter without the power amplifier, wherein the actual gain is compared with a desired gain of the power amplifier for a given supply voltage for the power amplifier.

The nonlinear transfer function may model a power amplifier supply voltage as a function of a voltage of the input signal. Determining the assumed performance may comprise determining a first power supply voltage $V_{CC1}$ by evaluating the nonlinear transfer function at the voltage of the input signal as the first value. In an analog manner, determining the actual performance may comprise determining a second power supply voltage $V_{CC0}$ by evaluating the nonlinear transfer function at a voltage of the feedback signal as the second value. The correctional value $G_{VCC}$ may be determined by evaluating a quotient of the first power supply voltage $V_{CC1}$ and the second power supply voltage $V_{CC0}$ such that $G_{VCC}=V_{CC1}/V_{CC0}$.

A default nonlinear transfer function is typically a result of a factory calibration of the power amplifier during which the nonlinear transfer function is adjusted so that a desired target gain of the power amplifier is reached for a certain load impedance at an output of the power amplifier.

Figure 12:
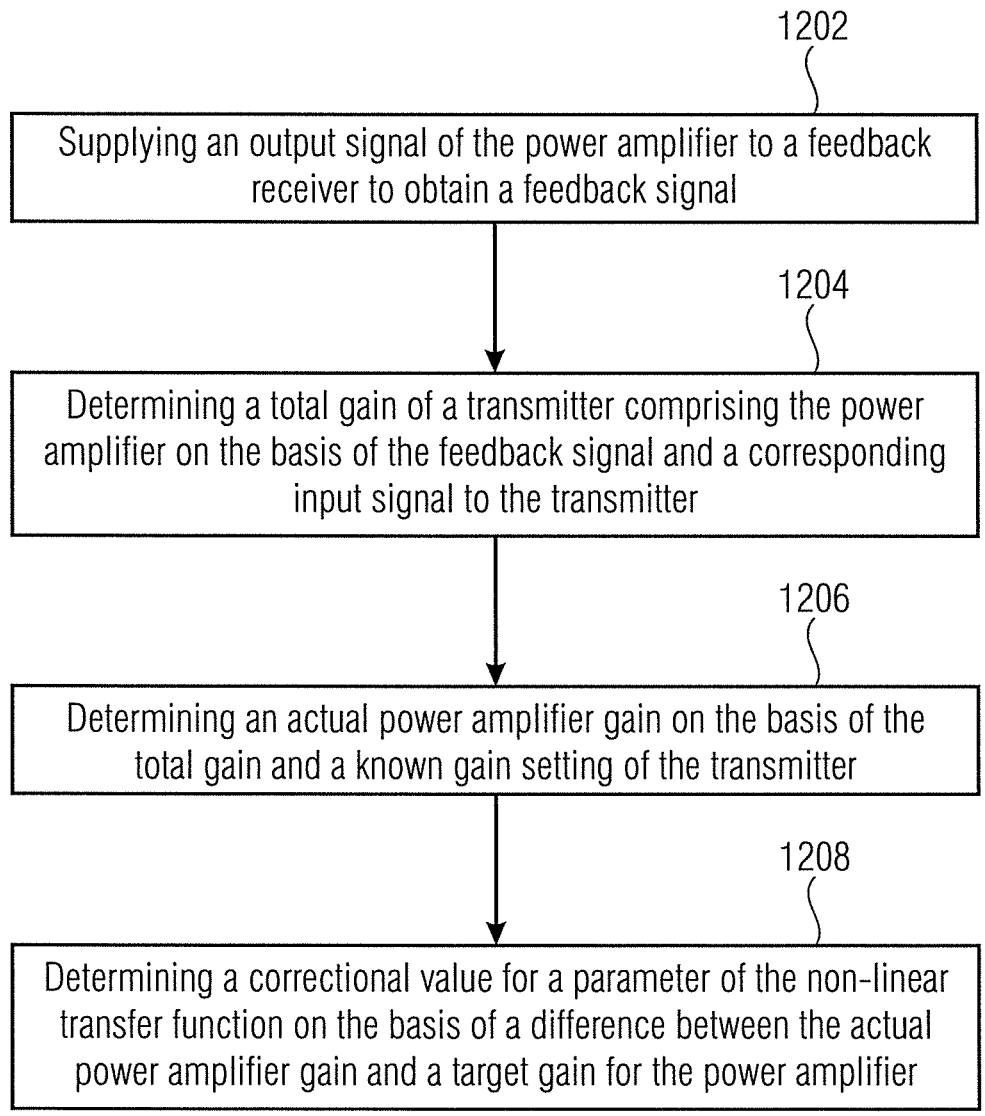
FIG. 12 shows a schematic flowchart of a method for re-calibrating a non-linear transfer function of an envelope tracking power supply.

FIG. 12 shows a schematic flowchart of a method for re-calibrating a non-linear transfer function of an envelope tracking power supply for a power amplifier during active transmission. The method comprises supplying an output signal of the power amplifier to a feedback receiver to obtain a feedback signal at 1202, and determining a total gain of a transmitter comprising the power amplifier based on the feedback signal and a corresponding input signal to the transmitter at 1204. The method further comprises determining an actual power amplifier gain based on the total gain and a known gain setting of the transmitter at 1206, and determining a correctional value for a parameter of the nonlinear transfer function based on a difference between the actual power amplifier gain and a target gain for the power amplifier at 1208.

Figure 13:
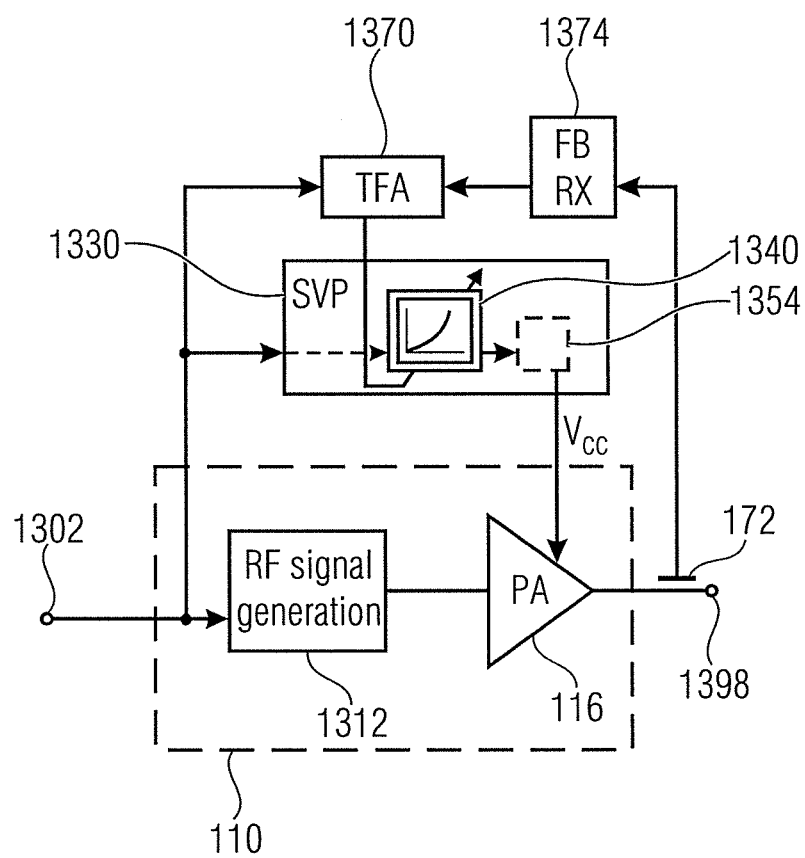
FIG. 13 shows a schematic block diagram of an envelope tracking system.

FIG. 13 shows a schematic block diagram of an envelope tracking system that comprises an envelope tracking power amplifier 116, a supply voltage provider (SVP) 1330, a feedback receiver (FB RX) 1374, and a transfer function adjuster (TFA) 1370. The supply voltage provider 1330 is configured to provide a variable supply voltage $V_{CC}$ for the envelope tracking power amplifier 116 based on an input signal applied to a transmitter 110 at an input terminal 1302 comprising the envelope tracking power amplifier 116. The variable supply voltage $V_{CC}$ is also based on a nonlinear transfer function 1340 of the variable supply voltage provider 1330 based on the input signal. The supply voltage provider 1330 may comprise an envelope tracking modulator 1354, an input of which is connected to an output of the nonlinear transfer function 1340 and an output of which is connected to a (pair or plurality) supply voltage terminal(s) of the envelope tracking power amplifier 116.

The feedback receiver 1374 is configured to receive an output signal of the envelope tracking power amplifier 116 and provide a corresponding feedback signal. The output signal of the envelope tracking power amplifier 116 is also provided to an output terminal 1398 of the envelope tracking system. The transfer function adjuster 1370 is configured to receive the input signal and the feedback signal, and further configured to determine a correctional value for the nonlinear transfer function 1340 based on the difference between an assumed performance of the envelope tracking power amplifier 116 and an actual performance of the envelope tracking amplifier 116. The assumed performance is determined based on the input signal and the nonlinear transfer function 1340. The actual performance is determined based on the feedback signal.

Figure 14:
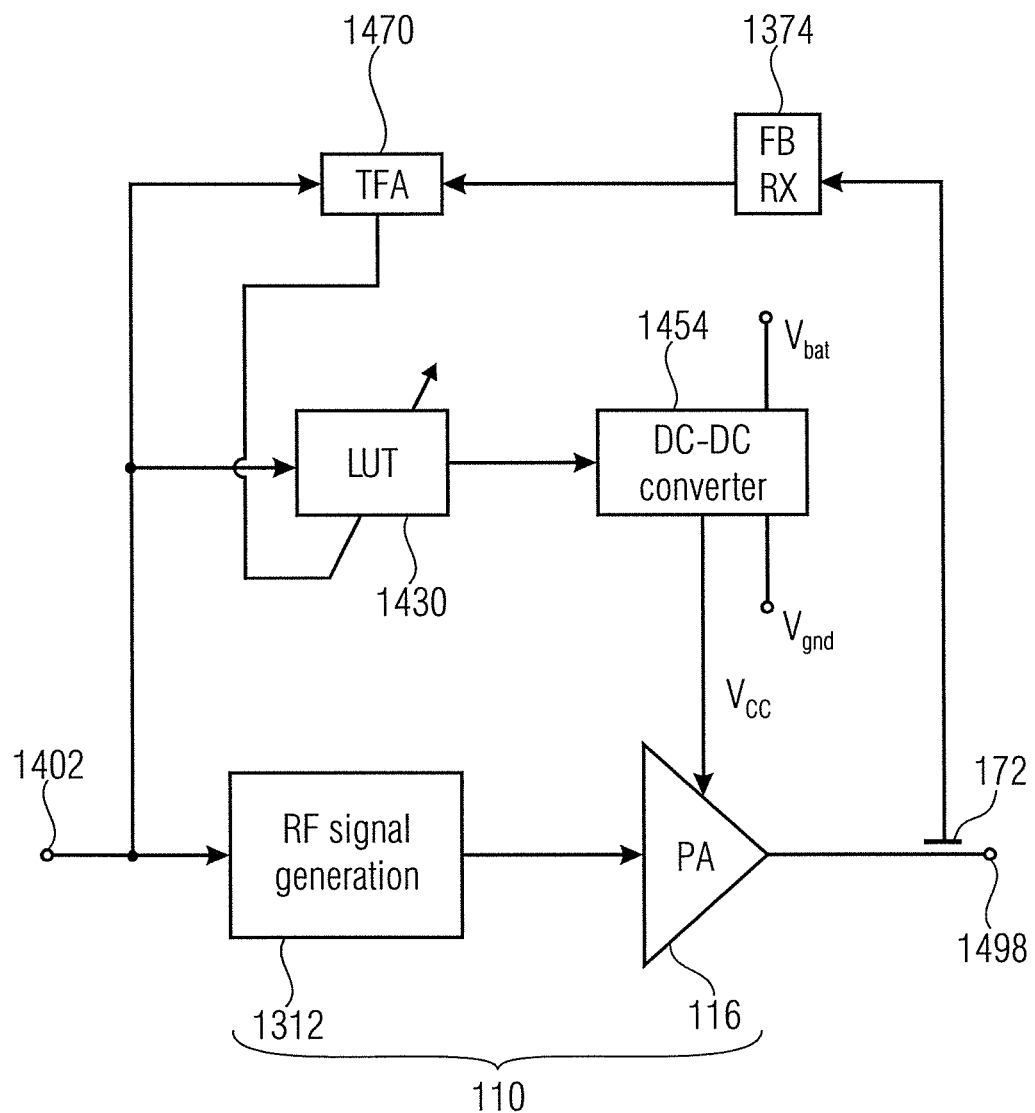
FIG. 14 shows a schematic block diagram of another example of an envelope tracking system.

FIG. 14 shows a schematic block diagram of another example of an envelope tracking system. The envelope tracking system comprises an envelope tracking power amplifier 116, a lookup table (LUT) 1430, a DC-DC converter 1454, a feedback receiver (FB RX) 1474, and a transfer function adjuster (TFA) 1470. The lookup table 1430 has stored at least one nonlinear transfer function of a variable supply voltage based on an input signal to a transmitter 110 comprising the envelope tracking power amplifier 116, wherein the lookup table 1430 is configured to provide, in response to an input signal value, a variable supply voltage value $V_{CC}$.

The DC-DC converter 1454 is configured to provide the variable supply voltage for the envelope tracking power amplifier 116 based on the variable supply voltage value provided by the lookup table 1430.

The feedback receiver 1474 is configured to receive an output signal of the envelope tracking power amplifier 116 and provide a corresponding feedback signal. The transfer function adjuster 1470 is configured to determine a total gain of the transmitter 110 comprising the envelope tracking amplifier 116 based on the input signal and the feedback signal. The transfer function adjuster 1470 is also configured to derive an actual power amplifier gain based on the total gain and a known gain setting of the transmitter 110, and determine a correctional value for a parameter of the nonlinear transfer function based on a difference between the actual power amplifier gain and a target gain for the envelope tracing power amplifier 116.

The output signal of the envelope tracking power amplifier 116 may also be tapped or obtained at an output of the duplexer 118, as the duplexer output signal is typically only slightly attenuated and possibly delayed with respect to the power amplifier output signal. Accordingly, the duplexer output signal may typically be regarded as the power amplifier output signal.

The assumed performance and the actual performance of the envelope tracking power amplifier 116 may be assessed based on the supply voltage that is supplied to the envelope tracking power amplifier 116. In order to reach a desired target gain, the envelope tracking power amplifier 116 may need a higher or a lower supply voltage. In terms of power efficiency one could say that the envelope tracking power amplifier performs "better" if it is capable (e.g., due to currently prevailing, favorable operating conditions such as temperature and antenna impedance) of reaching the desired target gain using a lower supply voltage.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus. Some or all of the method acts may be executed by (or using) a hardware apparatus, like a microprocessor, a programmable computer or an electronic circuit. Some one or more of the most important method acts may be executed by such an apparatus.

The implementation may be in hardware or in software or may be performed using a digital storage medium, for example a floppy disk, a DVD, a Blu-Ray, a CD, a ROM, a PROM, an EPROM, an EEPROM or a FLASH memory, having electronically readable control signals stored thereon, which cooperate (or are capable of cooperating) with a programmable computer system such that the respective method is performed. A data carrier may be provided which has electronically readable control signals, which are capable of cooperating with a programmable computer system, such that the method described herein is performed.

The implementation may also be in the form of a computer program product with a program code, the program code being operative for performing the method when the computer program product runs on a computer. The program code may be stored on a machine readable carrier.

The above described is merely illustrative, and it is understood that modifications and variations of the arrangements and the details described herein will be apparent to others skilled in the art. It is the intent, therefore, to be limited only by the scope of the impending claims and not by the specific details presented by way of description and explanation above.

The invention claimed is:

1. A method for adjusting a nonlinear transfer function of an envelope tracking power supply for a power amplifier, comprising:
   supplying an output signal of the power amplifier to a feedback receiver to obtain a feedback signal;
   determining an assumed performance of the power amplifier by evaluating the nonlinear transfer function at a first value defined by an input signal for a transmitter comprising the power amplifier;
   determining an actual performance of the power amplifier by evaluating the nonlinear transfer function at a second value defined by the feedback signal,
   wherein determining the actual performance comprises:
      determining a total gain of the transmitter based on the feedback signal and the input signal; and
      determining an actual gain of the power amplifier based on the total gain and a known gain of the transmitter without the power amplifier, wherein the actual gain is compared with a desired gain of the power amplifier for a given supply voltage for the Power amplifier; and
   determining a correctional value for a parameter of the nonlinear transfer function based on a difference between the assumed performance and the actual performance.

2. The method according to claim 1, wherein determining the assumed performance and the actual performance of the power amplifier comprises evaluating the nonlinear transfer function at a plurality of value pairs of corresponding to first and second values to obtain a plurality of differences between the assumed performance and the actual performance for a plurality of operating conditions of the envelope tracking power amplifier.

3. The method according to claim 1, further comprising:
   updating the nonlinear transfer function using the correctional value.

4. The method according to claim 1, wherein the parameter of the nonlinear transfer function is one of:
   an offset compensation for the input signal,
   an offset compensation for a supply voltage for the power amplifier,
   a gain compensation for the input signal,
   a gain compensation for the supply voltage, and
   parameters defining a shape of the nonlinear transfer function.

5. The method according to claim 1, wherein the method is performed during an active transmission mode of the power amplifier.

6. The method according to claim 1, further comprising:
   measuring a temperature of the transmitter; and
   determining a temperature-dependent overall gain of a portion of the transmitter based on the temperature, wherein the portion comprises the power amplifier;
   wherein determining the actual gain of the power amplifier is based on the temperature-dependent overall gain.

7. The method according to claim 1, further comprising:
   synchronizing a variable envelope tracking gain to a variable transmitter gain before determining the actual performance of the power amplifier.

8. The method according to claim 1, further comprising:
   controlling a power of the power amplifier via a closed power-control loop concurrently with envelope tracking, wherein the feedback signal is used by both the closed power-control loop and for adjusting the nonlinear tracking function, and
   correcting an overall gain of a portion of the transmitter that comprises the power amplifier by a compensation factor to compensate for a gain variation due to a change of a power amplifier supply voltage, the gain variation being caused by adjusting the nonlinear transfer function using the correctional value, wherein the compensation factor is determined based on a current feedback signal and a previous feedback signal.

9. The method according to claim 8, wherein the compensation factor is determined as a ratio of the current feedback signal and the previous feedback signal.

10. The method according to claim 1, further comprising:
    generating the first value used for determining the assumed performance as a root-mean-square value of the input signal; and
    generating the second value used for determining the actual performance as a root-mean-square value of the feedback signal.

11. The method according to claim 1, further comprising:
    generating the first value used for determining the assumed performance as a filtered value of the input signal; and
    generating the second value used for determining the actual performance as a filtered value of the feedback signal.

12. The method according to claim 1, wherein a default nonlinear transfer function is a result of a factory calibration of the power amplifier during which the nonlinear transfer function is adjusted so that a desired target gain of the power amplifier is reached for a certain load impedance at an output of the power amplifier.

13. A method for adjusting a nonlinear transfer function of an envelope tracking power supply for a power amplifier, comprising:
    supplying an output signal of the power amplifier to a feedback receiver to obtain a feedback signal;
    determining an assumed performance of the power amplifier by evaluating the nonlinear transfer function at a first value defined by an input signal for a transmitter comprising the power amplifier;
    determining an actual performance of the power amplifier by evaluating the nonlinear transfer function at a second value defined by the feedback signal; and
    determining a correctional value for a parameter of the nonlinear transfer function based on a difference between the assumed performance and the actual performance;
    wherein the nonlinear transfer function models a power amplifier supply voltage as a function of a voltage of the input signal;
    wherein determining the assumed performance comprises determining a first power supply voltage by evaluating the nonlinear transfer function at the voltage of the input signal as the first value;
    wherein determining the actual performance comprises determining a second power supply voltage by evaluating the nonlinear transfer function at a voltage of the feedback signal as the second value; and
    wherein determining the correctional value comprises evaluating a quotient of the first power supply voltage and the second power supply voltage.

14. A method for re-calibrating a nonlinear transfer function of an envelope tracking power supply for a power amplifier during active transmission, comprising:
    supplying an output signal of the power amplifier to a feedback receiver to obtain a feedback signal;

determining a total gain of a transmitter comprising the power amplifier based on the feedback signal and a corresponding input signal to the transmitter;

determining an actual power amplifier gain based on the total gain and a known gain setting of the transmitter; and determining a correctional value for a parameter of the nonlinear transfer function based on a difference between the actual power amplifier gain and a target gain for the power amplifier.

15. The method according to claim 14, wherein the total gain and the actual power amplifier gain are determined for a plurality of operating conditions of the envelope tracking power amplifier to obtain a plurality of differences between corresponding actual power amplifier gain values and target gain values; and wherein the correctional value is determined based on the plurality of differences.

16. The method according to claim 14, further comprising: updating the nonlinear transfer function using the correctional value.

17. The method according to claim 14, wherein the method is performed during an active transmission mode of the power amplifier.

18. The method according to claim 14, further comprising: measuring a temperature of the transmitter; and determining a temperature-dependent overall gain of a portion of the transmitter based on the temperature, wherein the portion comprises the power amplifier;

wherein determining the actual gain of the power amplifier is based on the temperature-dependent overall gain.

19. The method according to claim 14, further comprising: synchronizing a variable envelope tracking gain to a variable transmitter gain before determining the total gain of the transmitter.

20. The method according to claim 14, further comprising: controlling a power of the power amplifier by using a closed power-control loop concurrently with envelope tracking, wherein the feedback signal is used by both the closed power-control loop and for re-calibrating the nonlinear tracking function, and correcting an overall gain of a portion of the transmitter that comprises the power amplifier by a compensation factor to compensate for a gain variation due to a change of a power amplifier supply voltage, the gain variation being caused by adjusting the nonlinear transfer function using the correctional value, wherein the compensation factor is determined based on a current feedback signal and a previous feedback signal.

21. The method according to claim 14, further comprising: generating a root-mean-square value of the input signal to be used when determining the total gain; and generating a root-mean-square value of the feedback signal to be used when determining the total gain.

22. The method according to claim 14, wherein a default nonlinear transfer function is a result of a factory calibration of the power amplifier during which the nonlinear transfer function is adjusted so that a desired target gain of the power amplifier is reached for a certain load impedance at an output of the power amplifier.

23. An envelope tracking system, comprising:

a transmitter comprising an envelope tracking power amplifier;

a supply voltage provider configured to provide a variable supply voltage for the envelope tracking power amplifier based on an input signal of the transmitter and a nonlinear transfer function of the variable supply voltage based on the input signal;

a feedback receiver configured to receive an output signal of the envelope tracking power amplifier and provide a corresponding feedback signal; and a transfer function adjuster configured to receive the input signal and the feedback signal, and determine a correctional value for the nonlinear transfer function based on a difference between an assumed performance of the envelope tracking power amplifier and an actual performance of the envelope tracking amplifier, the assumed performance being determined based on the input signal and the nonlinear transfer function and the actual performance being determined based on the feedback signal wherein the nonlinear transfer function models a power amplifier supply voltage as a function of a voltage of the input signal;

wherein determining the assumed performance comprises determining a first power supply voltage by evaluating the nonlinear transfer function at the voltage of the input signal;

wherein determining the actual performance comprises determining a second power supply voltage by evaluating the nonlinear transfer function at a voltage of the feedback signal; and wherein determining the correctional value comprises evaluating a quotient of the first power supply voltage and the second power supply voltage.

24. The envelope tracking system according to claim 23, wherein the transfer function adjuster is further configured to evaluate the nonlinear transfer function at a plurality of value pairs of corresponding first and second values to obtain a plurality of differences between the assumed performance and the actual performance for a plurality of operating conditions of the envelope tracking power amplifier.

25. The envelope tracking system according to claim 23, wherein the transfer function adjuster is further configured to update the nonlinear transfer function using the correctional value.

26. The envelope tracking system according to claim 23, wherein the transfer function adjuster is further configured to receive a temperature measurement relative to a temperature of the transmitter and determine a temperature-dependent overall gain of a portion of the transmitter based on the temperature measurement, wherein the portion comprises the envelope tracking power amplifier, and wherein the determination of the actual gain of the envelope tracking power amplifier is based on the temperature-dependent overall gain.

27. The envelope tracking system according to claim 23, further comprising:

a closed power-control loop configured to control an output power of the envelope tracking power amplifier, wherein the feedback signal is used by both the closed power-control loop and the transfer function adjuster.

28. The envelope tracking system according to claim 27, further comprising:

an overall gain corrector configured to correct an overall gain of a portion of the transmitter that comprises the power amplifier by a compensation factor to compensate for a gain variation due to a change of the power amplifier supply voltage, the gain variation being caused by adjusting the nonlinear transfer function using the correctional value, wherein the compensation factor is determined based on a current feedback signal and a previous feedback signal.

29. A mobile communication device, comprising:
an RF circuit configured to provide or receive RF signals; and
an antenna port coupled to the RF circuit;
wherein the RF circuit comprises an envelope tracking system, the envelope tracking system comprising:
a transmitter comprising an envelope tracking power amplifier;
a supply voltage provider configured to provide a variable supply voltage for the envelope tracking power amplifier based on an input signal of the transmitter and a nonlinear transfer function that is a function of the input signal;
a feedback receiver configured to receive an output signal of the envelope tracking power amplifier and provide a corresponding feedback signal; and
a transfer function adjuster configured to determine a total gain of the transmitter based on the input signal and the feedback signal, derive an actual power amplifier gain based on the total gain and a known gain setting of the transmitter, and determine a correctional value for the nonlinear transfer function based on a difference between the actual power amplifier gain and a target gain for the power amplifier.

30. An envelope tracking system, comprising:
a transmitter comprising an envelope tracking power amplifier;
a lookup table having stored at least one nonlinear transfer function of a variable supply voltage based on an input signal to the transmitter, wherein the lookup table is configured to provide in response to an input signal value a variable supply voltage value;
a DC-DC converter configured to provide the variable supply voltage for the envelope tracking power amplifier based on the variable supply voltage value provided by the lookup table;
a feedback receiver configured to receive an output signal of the envelope tracking power amplifier and provide a corresponding feedback signal; and
a transfer function adjuster configured to determine a total gain of the transmitter based on the input signal and the feedback signal, to derive an actual power amplifier gain based on the total gain and a known gain setting of the transmitter, and determine a correctional value for a parameter of the nonlinear transfer function based on a difference between the actual power amplifier gain and a target gain for the power amplifier.

* * * * *